(12) United States Patent  (10) Patent No.: US 9,136,156 B2
Enomoto et al.  (45) Date of Patent: Sep. 15, 2015

(54) SUBSTRATE PROCESSING APPARATUS AND FILM DEPOSITION APPARATUS

(75) Inventors: Tadashi Enomoto, Iwate (JP);
Mitsuhiro Tachibana, Iwate (JP);
Haruhiko Furuya, Yamanashi (JP);
Kentaro Oshimo, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 546 days.

(21) Appl. No.: 13/599,082

(22) Filed: Aug. 30, 2012

(65) Prior Publication Data

US 2013/0061804 A1  Mar. 14, 2013

(30) Foreign Application Priority Data

Sep. 12, 2011  (JP) .................................. 2011-198360

(51) Int. Cl.
*C23C 16/00*  (2006.01)
*H01L 21/687*  (2006.01)
*H01L 21/67*  (2006.01)
*C23C 16/455*  (2006.01)

(52) U.S. Cl.
CPC ........ *H01L 21/68764* (2013.01); *C23C 16/455* (2013.01); *C23C 16/45506* (2013.01); *C23C 16/45551* (2013.01); *H01L 21/6719* (2013.01); *H01L 21/68771* (2013.01)

(58) Field of Classification Search
CPC ............ C23C 16/455; C23C 16/45548; C23C 16/4412

USPC .......................................................... 118/719
See application file for complete search history.

(56) References Cited

U.S. PATENT DOCUMENTS

2011/0039026 A1* 2/2011 Kato et al. ............... 427/255.26
2011/0139074 A1* 6/2011 Kato et al. .................... 118/730

FOREIGN PATENT DOCUMENTS

JP  2011-040574  2/2011
JP  2011-100956  5/2011
JP  2011-124384  6/2011

* cited by examiner

*Primary Examiner* — Keath Chen
(74) *Attorney, Agent, or Firm* — IPUSA, PLLC

(57) ABSTRACT

A substrate processing apparatus includes a processing chamber; process areas each of which supplies a reaction gas; a turntable that rotates to cause a substrate to pass through the process areas; a gas nozzle provided in one of the process areas; a separating area that supplies a separation gas to separate atmospheres of the process areas; and a cover part configured to cover the gas nozzle and cause the reaction gas supplied from the gas nozzle to remain around the gas nozzle. The cover part includes an upstream side wall, a downstream side wall, and an upper wall. The cover part also includes a guide surface configured to guide the separation gas to flow over a lower part of the upstream side wall to a space above the upper wall. The distance between the gas nozzle and the upstream side wall is greater than or equal to 8 mm.

8 Claims, 14 Drawing Sheets

EVALUATION TEST 2-1

EVALUATION TEST 2-2

SUBSTRATE PROCESSING APPARATUS AND FILM DEPOSITION APPARATUS

CROSS-REFERENCE TO RELATED APPLICATION

The present application is based upon and claims the benefit of priority of Japanese Patent Application No. 2011-198360, filed on Sep. 12, 2011, the entire contents of which are incorporated herein by reference.

BACKGROUND OF THE INVENTION

1. Field of the Invention

An aspect of this disclosure relates to a substrate processing apparatus and a film deposition apparatus.

2. Description of the Related Art

A contact structure is a type of multilayer interconnection structure where contact holes are formed in an interlayer insulating film between a lower wiring layer and an upper wiring layer to connect the upper and lower wiring layers. In the contact structure, for example, a metallic material such as aluminum, tungsten, or copper is embedded in the contact holes. On the inner surface of each contact hole, a barrier film of, for example, titanium nitride (TiN) is formed to prevent the metallic material from being diffused into the interlayer insulating film.

To form such a barrier film on the inner surface of a contact hole, for example, an atomic layer deposition (ALD) method or a molecular layer deposition (MLD) method may be used. In an exemplary process of forming a TiN film using such a deposition method, a titanium tetrachloride ($TiCl_4$) gas is supplied to a semiconductor wafer (hereafter, simply referred to as "wafer") so that Ti molecules are adsorbed on the wafer, and then an ammonia ($NH_3$) gas is supplied to the wafer to nitride the Ti molecules and thereby form a TiN molecular layer. The $TiCl_4$ gas and the $NH_3$ gas (reaction gases) are alternately supplied to the wafer repeatedly to stack TiN molecular layers.

An exemplary apparatus for such a film forming process may include a processing chamber, a turntable provided in the processing chamber and on which a wafer is to be placed, process areas where reaction gases are supplied to the wafer on the turntable, and a separating area provided between the process areas in the rotational direction of the turntable and where a separation gas is supplied. In the apparatus, as the turntable rotates, the wafer sequentially passes through the process areas where the reaction gases are supplied. The wafer is heated while the turntable is rotated so that the reaction gases in the process areas are activated by heat energy received from the wafer, and adsorption and nitriding of molecules thereby occur as described above.

Here, there may be cases where the reaction gases spread in the processing chamber and are unable to receive sufficient heat energy, and where the reaction gases are diluted by the separation gas. If such problems occur, Ti molecules may not be adsorbed on the wafer or may not be sufficiently nitrided and as a result, a TiN film with desired quality may not be obtained.

Japanese Laid-Open Patent Publication No. 2011-100956 discloses a film deposition apparatus including a flow regulating part. The flow regulating part includes a base that covers the upper and side surfaces of a gas nozzle, and flow regulating plates protruding from the lower end of the base in the upstream and downstream directions of rotation of a turntable (may be referred to as "rotationally-upstream and rotationally-downstream directions"). However, in JP2011-100956, there is no mention about the distance in the rotationally-upstream direction from the side surface of the gas nozzle to a wall of the flow regulating part. If the distance is small, the pressure of the reaction gas below the gas nozzle increases, and the reaction gas flows in the rotationally-upstream direction and flows over the flow regulating part together with the separation gas. Accordingly, there is a demand for an apparatus that can increase the density of a reaction gas in a process area and thereby reliably process a substrate.

SUMMARY OF THE INVENTION

In an aspect of this disclosure, there is provided a substrate processing apparatus that includes a processing chamber; process areas provided in the processing chamber, each configured to supply a reaction gas to process a substrate; a turntable provided in the processing chamber and configured to rotate such that the substrate placed on the upper surface of the turntable passes through the process areas in sequence; a gas nozzle provided in one of the process areas and extending in a direction that intersects with a rotational direction of the turntable; a separating area provided between the process areas in the rotational direction and configured to supply a separation gas to separate atmospheres of the process areas; and a cover part configured to cover the gas nozzle and cause the reaction gas supplied from the gas nozzle to remain around the gas nozzle. The cover part includes an upstream side wall disposed upstream of the gas nozzle in the rotational direction, a downstream side wall disposed downstream of the gas nozzle in the rotational direction, and an upper wall disposed above the gas nozzle and configured to cause the separation gas flowing from an upstream side in the rotational direction to flow over the cover part to a downstream side in the rotational direction. The cover part further includes a guide surface configured to guide the separation gas flowing from the upstream side in the rotational direction to flow over a lower part of the upstream side wall to a space above the upper wall. The distance between the gas nozzle and the upstream side wall is greater than or equal to 8 mm.

DESCRIPTION OF THE PREFERRED EMBODIMENTS

Preferred embodiments of the present invention are described below with reference to the accompanying drawings.

Figure 1:
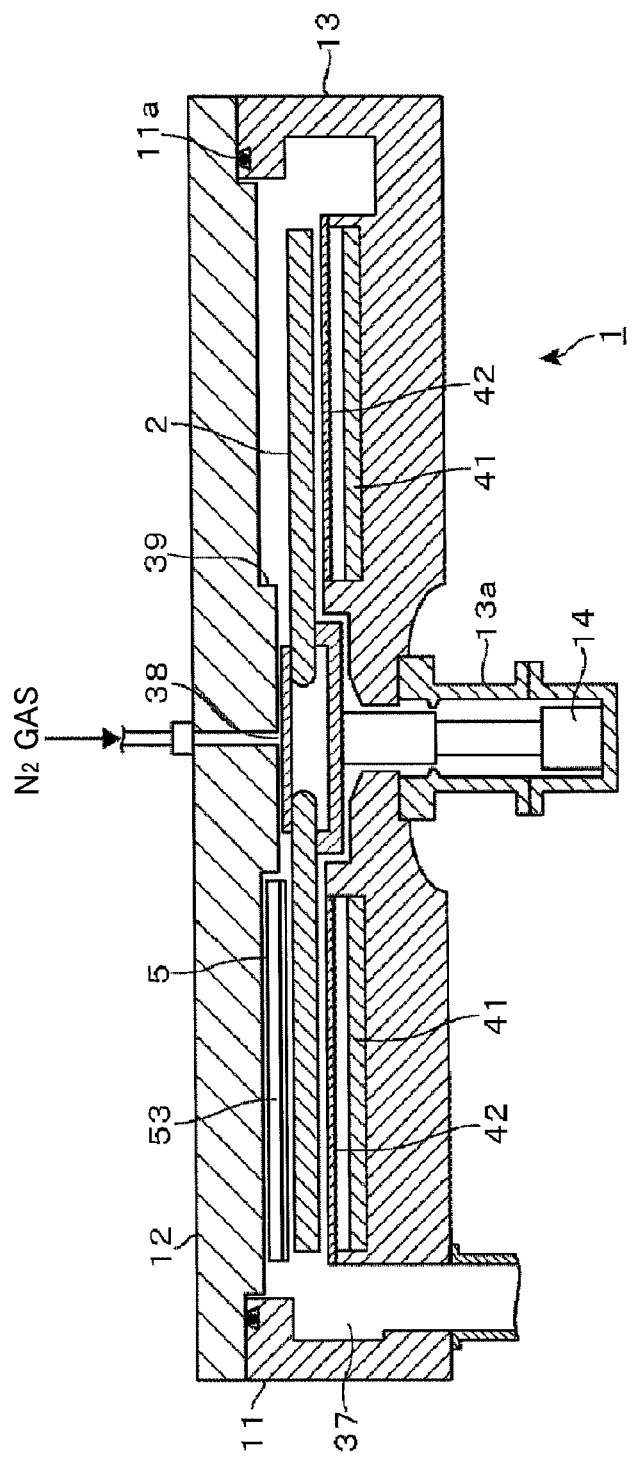
FIG. 1 is a cut-away side view of a film deposition apparatus according to an embodiment.
Figure 2:
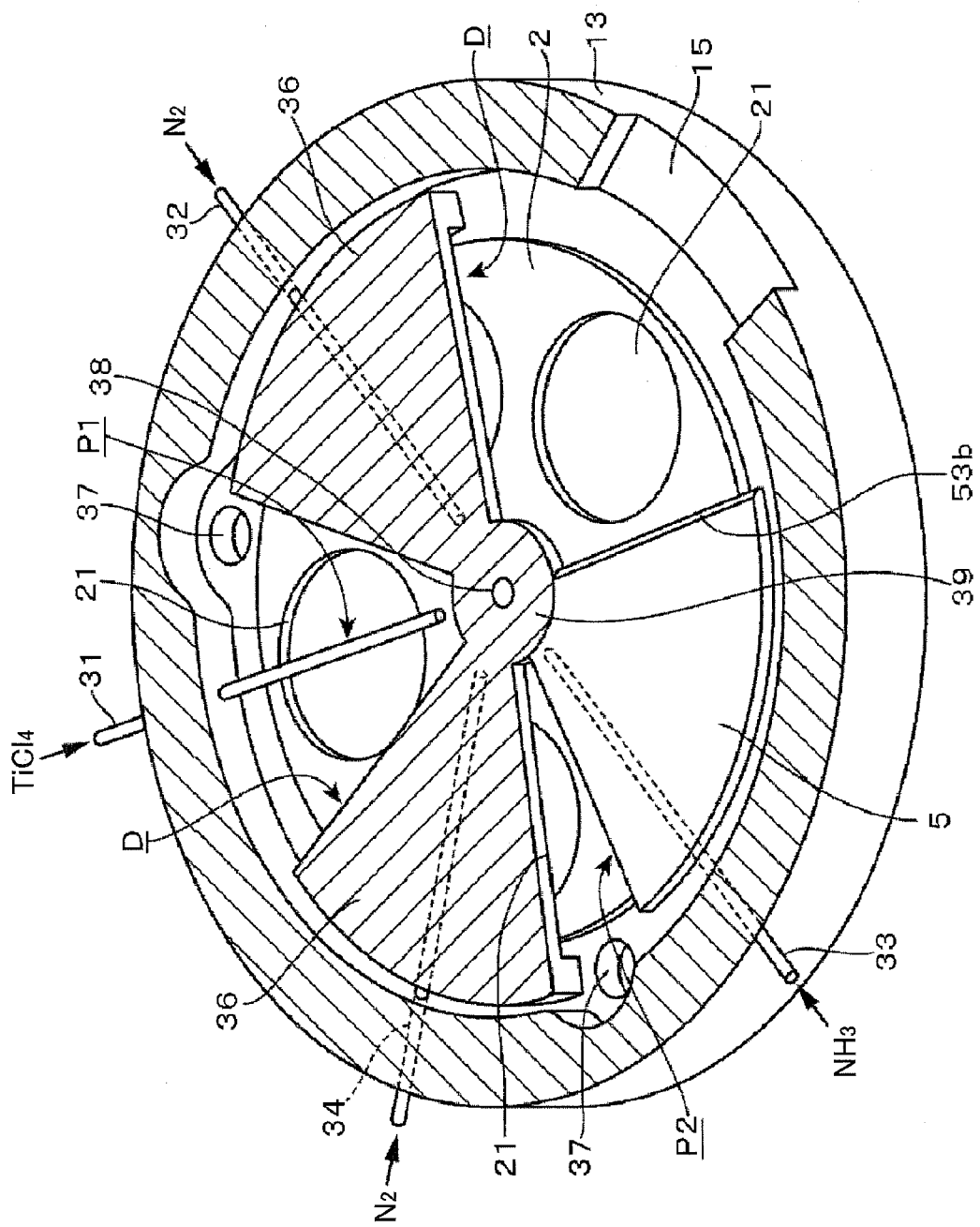
FIG. 2 is a perspective view of the film deposition apparatus of FIG. 1.
Figure 3:
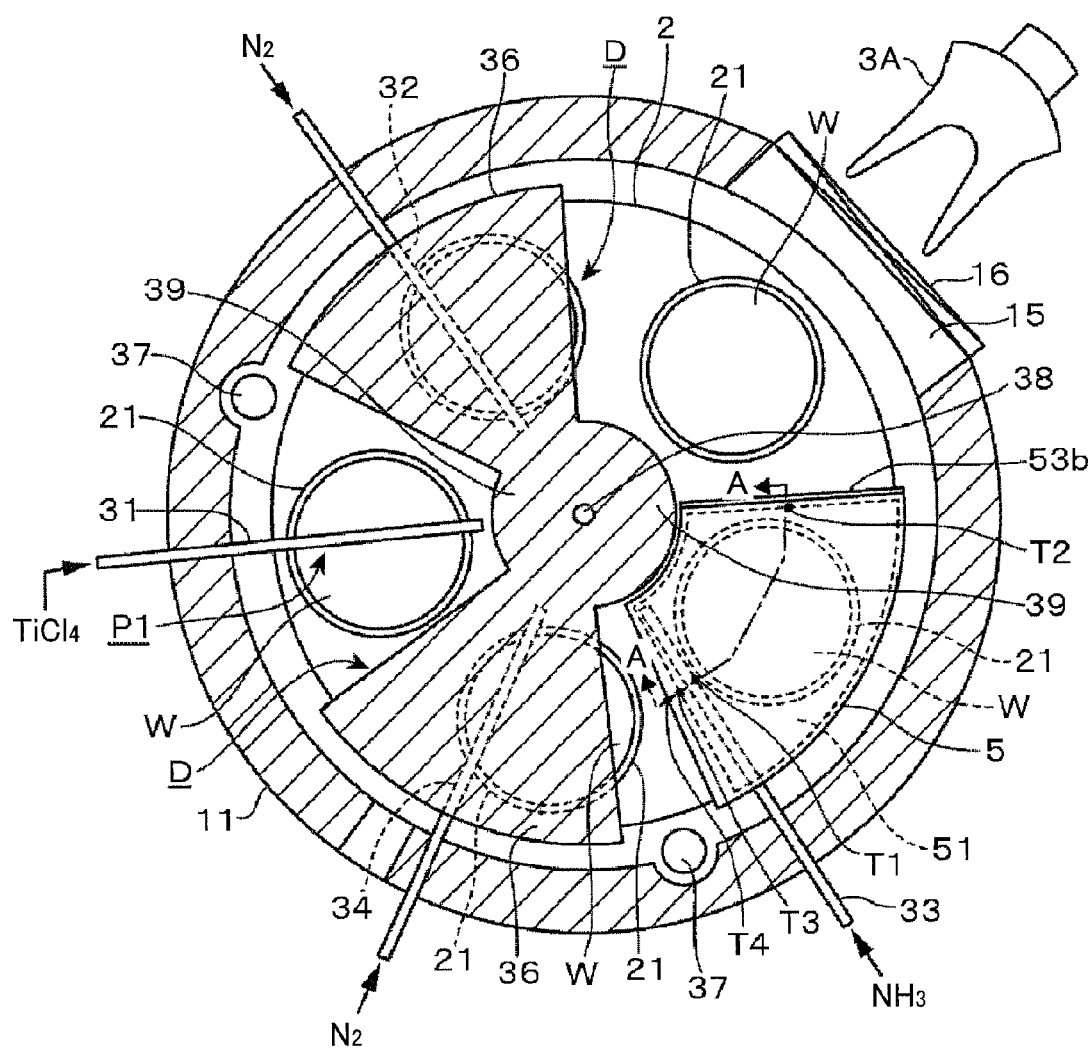
FIG. 3 is a plan view of the film deposition apparatus of FIG. 1.

A film deposition apparatus 1, which is an embodiment of a substrate processing apparatus, is described below. The film deposition apparatus 1 performs atomic layer deposition (ALD) or molecular layer deposition (MLD) on substrates such as semiconductor wafers W (hereafter, simply referred to as "wafers W"). FIG. 1 is a cut-away side view, FIG. 2 is a perspective view, and FIG. 3 is a plan view of the film deposition apparatus 1. The film deposition apparatus 1 may include a flat, substantially-circular vacuum chamber (processing chamber) 11 and a substantially-circular turntable 2 disposed horizontally in the vacuum chamber 11. The vacuum chamber 11 is surrounded by an ambient atmosphere. When the wafers W are processed, a vacuum environment is created in the vacuum chamber 11. The vacuum chamber 11 may include a top plate 12 and a chamber body 13 that forms the side wall and the bottom of the vacuum chamber 11. In FIG. 1, 1ie indicates a sealing part for keeping the vacuum chamber air tight, and 13a indicates a cover for covering a central part of the chamber body 13.

The turntable 2 is connected to a rotary driving mechanism 14 and is rotated by the rotary driving mechanism 14 in the circumferential direction around its center axis. Hereafter, "rotationally-upstream direction", "rotationally-downstream", "rotationally-upstream side", and "rotationally-downstream side" may indicate directions and relative positions with respect to the rotational direction of the turntable 2. On the upper surface (first surface) of the turntable 2, five recesses 21 are formed along the rotational direction of the turntable 2. The wafers W are placed in the recesses 21. Along with the rotation of the turntable 2, the wafers W rotate around the center axis of the turntable 2. In FIGS. 2 and 3, reference number 15 indicates a transfer opening. As illustrated in FIG. 3, a shutter 16 is provided to open and close the transfer opening 15. Three holes (not shown) extending in the thickness direction of the turntable 2 are formed in the bottom of each recess 21. Elevating pins (not shown) move up and down through the corresponding holes in the recess 21 to pass and receive the wafer W to and from a transfer mechanism 3A.

A first reaction gas nozzle 31, a separation gas nozzle 32, a second reaction gas nozzle 33, and a separation gas nozzle 34 are arranged in the circumferential direction above the turntable 12 in the order mentioned. The first reaction gas nozzle 31, the separation gas nozzle 32, the second reaction gas nozzle 33, and the separation gas nozzle 34 are shaped like rods, and extend from the circumference toward the center of the turntable 2. The gas nozzles 31 through 34 have discharge openings 35 (see FIG. 6) facing downward. The discharge openings 35 are arranged along the length of the respective gas nozzles 31 through 34, and supply gases along the radius of the turntable 2. During a film deposition process (or film forming process), the first reaction gas nozzle 31 discharges a $TiCl_4$ gas, and the second reaction gas nozzle 33 discharges an $NH_3$ gas. Meanwhile, the separation gas nozzles 32 and 34 discharge a nitrogen ($N_2$) gas. A retaining space forming part 5 is provided to cover the second reaction gas nozzle 33. The retaining space forming part 5 is described later in detail.

The top plate 12 of the vacuum chamber 11 includes two fan-shaped protrusions 36 that protrude downward and are arranged at an interval in the circumferential direction. Each of the separation gas nozzles 32 and 24 is embedded in the corresponding protrusion 36 and divides the protrusion 36 in the circumferential direction. The first reaction gas nozzle and the second reaction gas nozzle 33 are disposed apart from the protrusions 36.

In the present embodiment, an area below the first reaction gas nozzle 31 where the $TiCl_4$ gas is supplied is referred to as a first process area P1, and an area below the second reaction gas nozzle 33 where the $NH_3$ gas is supplied is referred to as a second process area 22. Areas below the protrusions 36 are referred to as separating areas D. During a film deposition process, the $N_2$ gas supplied from the separation gas nozzles 32 and 34 to the separating areas D spreads in the circumferential direction in the separating areas D, thereby preventing the $TiCl_4$ gas and the $NH_3$ gas from mixing with each other on the turntable 2, and causing the $TiCl_4$ gas and the $NH_3$ gas to flow into corresponding evacuation ports 37. The evacuation ports are formed in the bottom of the vacuum chamber 11, and disposed at the outer side, in the radial direction of the turntable 2, of regions between the process areas 21 and 22 and the separating areas D located adjacent to the process areas 21 and P2 in the rotational direction of the turntable 2.

Also during a film deposition process, an $N_2$ gas is supplied to a center area 38 of the turntable 2. The top plate 12 includes a circular protrusion 39 protruding downward. The $N_2$ gas supplied to the center area 38 flows under the lower end of the protrusion 39, spreads outward in the radial direction of the turntable 2, and thereby prevents the $TiCl_4$ gas and the $NH_3$ gas from mixing with each other in the center area 38. The outer circumference of the protrusion 39 is connected with the inner ends of the protrusions 36. Although not shown, the $N_2$ gas is also supplied into the cover 13a and to the underside of the turntable 2 to purge the reaction gases.

A heater 41 is provided at the bottom of the vacuum chamber 11, i.e., below the turntable 2. Radiant heat from the heater 41 increases the temperature of the turntable 2 and thereby heats the wafers W placed in the recesses 21. A shield 42 is provided over the heater 41 to prevent film formation on the heater 41.

Figure 4:
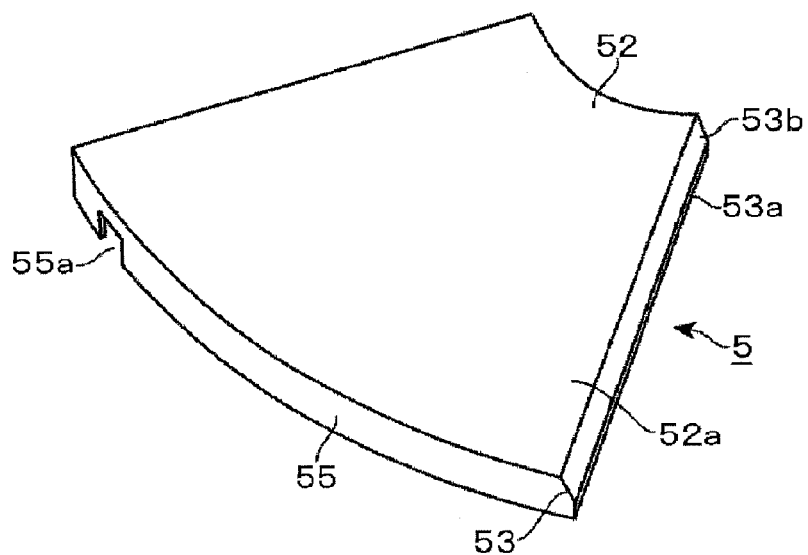
FIG. 4 is an upper perspective view of a retaining space forming part according to an embodiment.
Figure 5:
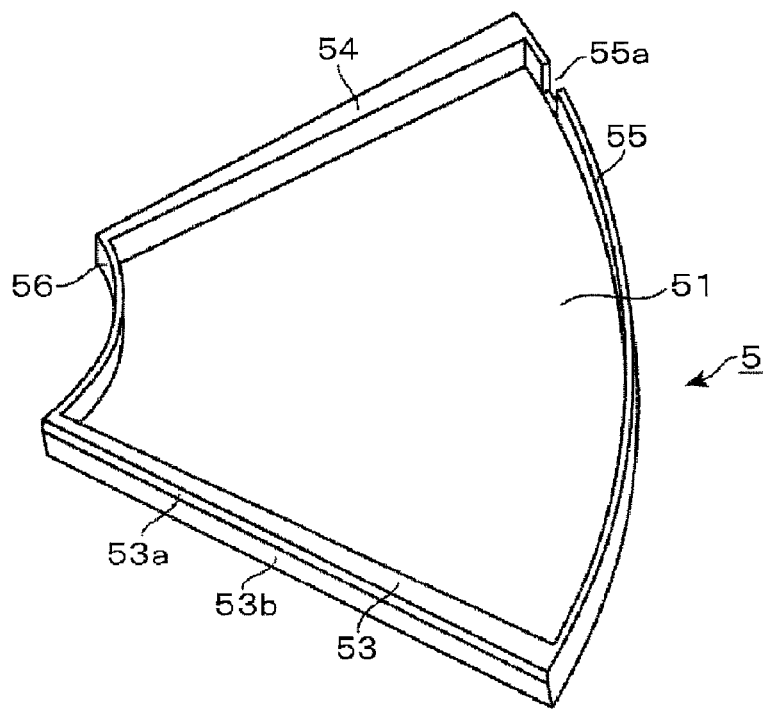
FIG. 5 is a bottom perspective view of the retaining space forming part of FIG. 4.
Figure 6:
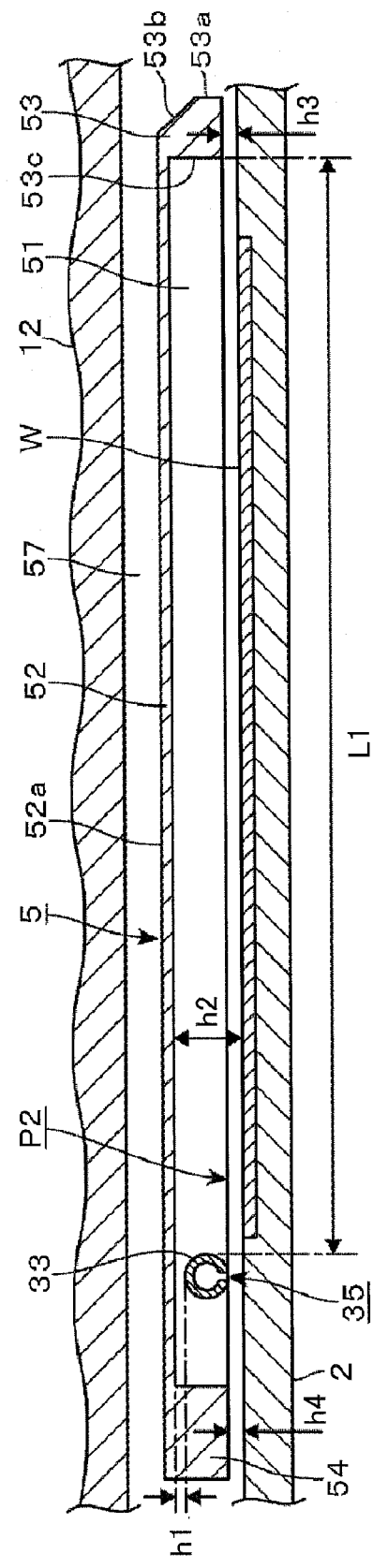
FIG. 6 is a cross-sectional view of the retaining space forming part taken along line A-A of FIG. 3.

Next, the retaining space forming part (cover) 5 is described below. FIG. 4 is an upper perspective view and FIG. 5 is a bottom perspective view of the retaining space forming part 5. FIG. 6 is a cross-sectional view of the retaining space forming part 5 taken along line A-A of FIG. 3. The retaining space forming part 5 surrounds the second reaction gas nozzle 33 and forms a retaining space 51 for the $NH_3$ gas. The retaining space 51 enables the $NH_3$ gas supplied from the second reaction gas nozzle 33 to remain around the second reaction gas nozzle 33 so that the density of the $NH_3$ gas around the second reaction gas nozzle 33 is increased (or maintained at a high level) and the nitriding process is stably performed.

The retaining space forming part 5 has a fan shape in plan view, and becomes gradually wider in the direction from the center to the outer circumference of the turntable 2. The retaining space forming part 5 is fixed by a fixing part (not shown) at a position above the turntable 2 in the vacuum chamber 11. The retaining space forming part 5 may include an upper wall 52 covering the upper surface of the second reaction gas nozzle 33, an upstream side wall 53 covering a rotationally-upstream side of the second reaction gas nozzle 33 (i.e., disposed upstream of the second reaction gas nozzle 33 in the rotational direction of the turntable 2), a downstream side wall 54 covering a rotationally-downstream side of the second reaction gas nozzle 33 (i.e., disposed downstream of the second reaction gas nozzle 33 in the rotational direction), an outer wall 55 at the outer circumference of the turntable 2, and an inner wall 56 facing the center of the turntable 2. The retaining space 51 is formed by the upper wall 52, the upstream side wall 53, the downstream side wall 54, the outer wall 55, and the inner wall 56. Accordingly, the retaining space 51 is shaped like a fan in plan view. A slit 55a is formed in the outer wall 55. The second reaction gas nozzle 33 is inserted through the slit 55a into the retaining space 51.

As illustrated in FIG. 6, a gap is provided between the second reaction gas nozzle 33 and the upper wall 52 to allow the $NH_3$ gas to flow through the gap h1. A distance h1 of the gap between the second reaction gas nozzle 33 and the upper wall 52 is preferably set at a value from 1 mm to 20 mm. In this example, the distance h1 is set at 2 mm. To retain the $NH_3$ gas with a sufficient density in the retaining space 51, a distance h2 of the gap between the upper wall 52 and the turntable 2 is preferably set at a value from 12 mm to 30 mm. The upper wall 52 has a horizontal surface 52a as the upper surface. A gap is also provided between the horizontal surface 52a and the top plate 12 of the vacuum chamber 11. This gap is referred to as a flow-through space 57 through which the $N_2$ gas flows.

The upstream side wall 53 includes a vertical surface 53a, and a sloping surface 53b that is connected to the vertical surface 53a and slopes upward in the rotationally-downstream direction. The downstream end of the sloping surface 53b is connected to the horizontal surface 52a. The vertical surface 53a and the sloping surface 53b function as a guide surface that guides the $N_2$ gas flowing from the rotationally-upstream side onto the horizontal surface 52a. A distance h3 of the gap between the upstream side wall 53 and the turntable 2 is preferably set at a value from 1 mm to 5 mm to prevent the $N_2$ gas from flowing into the retaining space 51 and thereby increase the density of the $NH_3$ gas in the retaining space 51.

The $NH_3$ gas discharged from the second reaction gas nozzle 33 strikes the turntable 2 and spreads in the rotationally-upstream and rotationally-downstream directions. If the distance between the second reaction gas nozzle 33 and the upstream side wall is small, the $NH_3$ gas flowing in the rotationally-upstream direction leaks out of the retaining space 51 through the gap between the upstream side wall 53 and the turntable 2. The leaked $NH_3$ gas is guided together with the $N_2$ gas by the upstream side wall 53 (the vertical surface 53a and the sloping surface 53b) to the flow-through space 57. As a result, the density of the $NH_3$ gas in the retaining space 51 is reduced. To prevent this reduction in the density of the $NH_3$ gas in the retaining space 51, it is necessary to properly set a distance L1 between (an upstream side surface of) the second reaction gas nozzle 33 and an inner surface 53c of the upstream side wall 53.

Since the retaining space 51 has a fan shape as described above, the distance L1 in FIG. 6 varies depending on positions along the length of the second reaction gas nozzle 33, i.e., the distance L1 becomes smaller as it comes closer to the center of the turntable 2. In the present embodiment, the second reaction gas nozzle 33 and the upstream side wall 53 are preferably disposed such that the distance L1 is greater than or equal to 8 mm at any position along the length of the second reaction gas nozzle 33. Referring to FIG. 3, the distance between a point T1 on the side surface (upstream side surface) of the second reaction gas nozzle 33 and a point 12 on the inner surface 53c of the upstream side wall 53 along the dashed-dotted line is, for example, 341.55 mm.

A distance h4 in FIG. 6 of the gap between the turntable 2 and the downstream side wall 54 is preferably set at a value from 1 mm to 5 mm to exhaust extra $NH_3$ gas while preventing reduction in the density of the $NH_3$ gas in the retaining space 51. Referring again to FIG. 3, the distance between a point T3 on the side surface (downstream side surface) of the second reaction gas nozzle 33 and a point T4 on the inner surface of the downstream side wall 54 is, for example, 30.34 mm.

Next, operations of the film deposition apparatus 1 are described. When the transfer mechanism 3A holding a wafer W enters the vacuum chamber 11 via the transfer opening 15, elevating pins (not shown) protrude from the holes in the recess 21 facing the transfer opening 15 to lift the wafer W above the turntable 2, and the wafer W is passed from the transfer mechanism 3A to the recess 21. When the wafers W are placed on the respective recesses 21, vacuum pumps connected to the evacuation ports 37 evacuate the vacuum chamber 11 and as a result, a vacuum environment at a predetermined pressure is created in the vacuum chamber 11. Then, the turntable 2 is rotated clockwise as indicated by an arrow 43 in FIG. 7, and the wafers W on the turntable 2 are heated by the heater 41 to, for example, 350° C.

Figure 7:
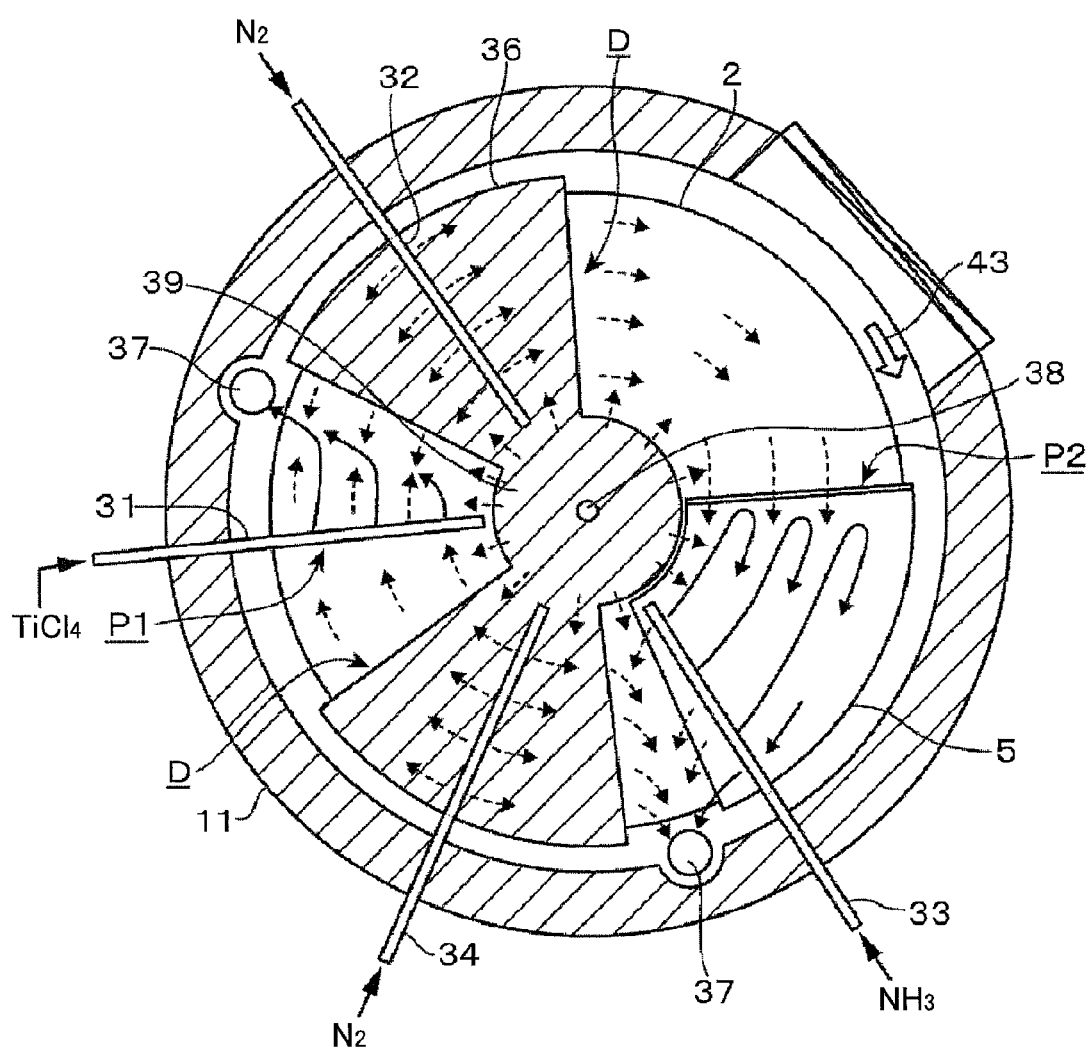
FIG. 7 is a drawing illustrating flow of gases in the film deposition apparatus of FIG. 1.

Next, gases are supplied from the gas nozzles 31 through 34. Each wafer W is caused to alternately pass through the first process area P1 below the first reaction gas nozzle 31 and the second process area P2 below the second reaction gas nozzle 33. In FIG. 7, solid-line arrows indicate the flow of the reaction gases, and dotted-line arrows indicate the flow of the separation gas. In the first process area P1, the $TiCl_4$ gas is supplied to the wafer W so that Ti molecules are adsorbed on the wafer W. Then, in the retaining space 51 (the second process area P2), the $NH_3$ gas is supplied to nitride the Ti molecules on the wafer W. Through the above film deposition process, one or more TiN molecular layers are formed on the wafer W. Multiple TiN molecular layers may be stacked on the wafer W by repeatedly rotating the turntable 2.

Meanwhile, the $N_2$ gas supplied from the separation gas nozzles 32 and 34 to the separating areas D spreads in the circumferential direction in the separating areas D, and thereby prevents the $TiCl_4$ gas and the $NH_3$ gas from mixing with each other on the turntable 2. Also during the film deposition process, the $N_2$ gas is supplied to the center area 38 of the turntable 2. The $N_2$ gas supplied to the center area 38 flows under the lower end of the circular protrusion 39, spreads outward in the radial direction of the turntable 2, and thereby prevents the $TiCl_4$ gas and the $NH_3$ gas from mixing with each other in the center area 38. Although not shown, the $N_2$ gas is also supplied into the cover 13a and to the underside of the turntable 2 to purge the reaction gases.

Figure 8:
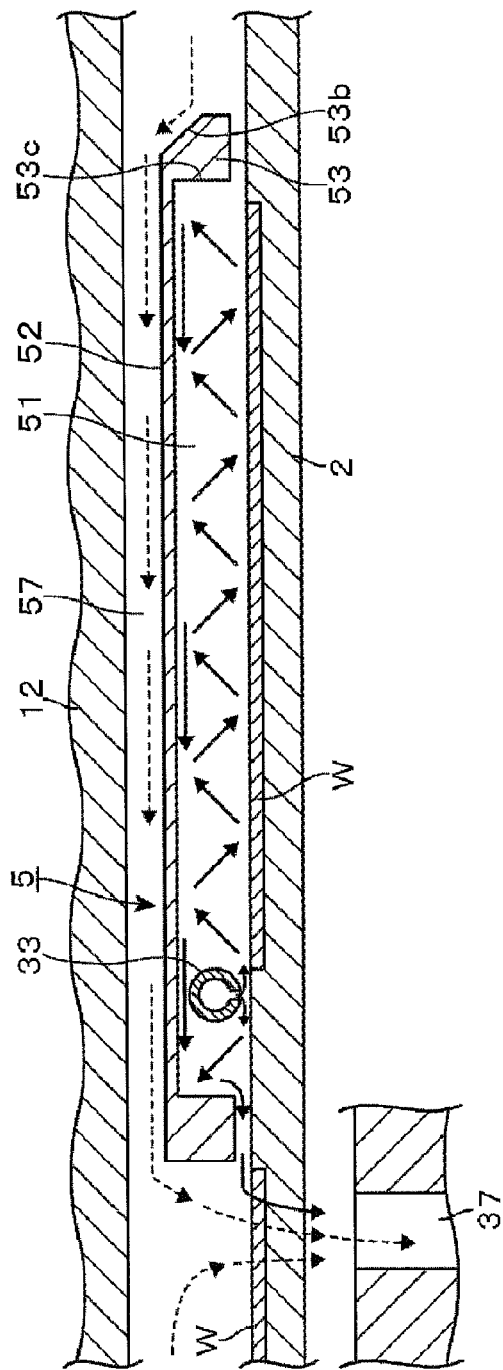
FIG. 8 is a drawing illustrating flow of gases around the retaining space forming part of FIG. 4.

In FIG. 8, flow of gases around the retaining space forming part 5 is indicated by arrows. Similarly to FIG. 7, solid-line arrows indicate the flow of the $NH_3$ gas, and dotted-line arrows indicate the flow of the $N_2$ gas. The $N_2$ gas flowing from the rotationally-upstream side toward the retaining space forming part 5 flows over the sloping surface 53b of the upstream side wall 53 and is guided to the flow-through space 57 above the retaining space forming part 5. Since the vacuum chamber is being evacuated via the evacuation port 37 near the rotationally-downstream end of the flow-through space 57, the $N_2$ gas flows through the flow-through space 57 in the downstream direction into the evacuation port 37 and is discharged from the vacuum chamber 11.

In the retaining space 51, the $NH_3$ gas discharged from the second reaction gas nozzle 33 strikes the turntable 2 and spreads in the rotationally-upstream and rotationally-downstream directions. The spreading of the $NH_3$ gas is limited by the walls of the retaining space forming part 5 and as a result, the density of the $NH_3$ gas in the retaining space 51 around the second reaction gas nozzle 33 is maintained at a high level. Since the retaining space 51 is a narrow, enclosed space, the discharged $NH_3$ gas forms a turbulent flow that hits the walls of the retaining space forming part 5 and the turntable 2 while flowing in the retaining space 51. Also, since the distance L1 between the second reaction gas nozzle 33 and the inner surface 53c is set at a large value as described above, excessive increase in the partial pressure of the $NH_3$ gas between the second reaction gas nozzle 33 and the inner surface 53c is prevented. This in turn prevents the $NH_3$ gas from flowing out of the retaining space 51 and over the upstream side wall 53.

The $NH_3$ gas retained in the retaining space 51 is heated and activated by heat energy from the wafer W and the turntable 2 and adsorbed on the Ti molecules on the wafer W to form a TiN film. Extra $NH_3$ gas flowing in the rotationally-upstream direction from the second reaction gas nozzle 33 is caused to flow back in the rotationally downstream direction because the vacuum chamber 11 is being evacuated via the evacuation port 37, flows further downstream through the gap between the second reaction gas nozzle 33 and the upper wall 52, and flows out of the retaining space 51 through the gap between the downstream side wall 54 and the turntable 2. Then, the extra $NH_3$ gas is exhausted via the evacuation port 37. Similarly, extra $NH_3$ gas flowing in the rotationally-downstream direction from the reaction gas nozzle 33 flows out of the retaining space 51 through the gap between the downstream side wall 54 and the turntable 2 and is exhausted via the evacuation port 37. As described above, the $NH_3$ gas flows as a turbulent flow in the retaining space 51. This in turn makes it possible to increase the period of time from when the $NH_3$ gas is discharged from the second reaction gas nozzle 33 to when the $NH_3$ gas is exhausted. Accordingly, the turbulent flow of the $NH_3$ gas is also one of the factors that contribute to increasing the density and partial pressure of the $NH_3$ gas in the retaining space 51.

After the turntable 2 is rotated for a predetermined number of times and a TiN film with a predetermined thickness is formed, the supply of gases is stopped and the power of the heater 41 is reduced to lower the temperature of the wafer W. Then, the elevating pins protrude to lift the wafer W in the recess 21, and the transfer mechanism 3A receives the lifted wafer W and carries the wafer W out of the vacuum chamber 11.

As described above, the film deposition apparatus 1 of the present embodiment includes the retaining space forming part 5 that makes it possible to prevent the $NH_3$ gas from spreading out of an area around the second reaction gas nozzle 33. The retaining space forming part 5 also makes it possible to prevent the $N_2$ gas from flowing into the area around the second reaction gas nozzle 33 and thereby prevent the $NH_3$ gas from being diluted. Further, the retaining space forming part 5 makes it possible to increase the period of time for which the $NH_3$ gas remains in the area around the second reaction gas nozzle 33, i.e., on the surface of the wafer W. This configuration makes it possible to increase the partial pressure and density of the $NH_3$ gas around the second reaction gas nozzle 33 and to sufficiently heat and activate the $NH_3$ gas so that the reactivity of the $NH_3$ gas with the wafer W is increased. This in turn makes it possible to reliably nitride the Ti molecules and thereby improve the quality of a TiN film formed on the wafer W.

Although the retaining space forming part 5 is provided around the second reaction gas nozzle 33 in the present embodiment, the retaining space forming part 5 may be provided around the first reaction gas nozzle 31 or around each of the first reaction gas nozzle 31 and the second reaction gas nozzle 33. With the retaining space forming part 5 provided around the first reaction gas nozzle 31, it is possible to increase the partial pressure and density of the $TiCl_4$ gas around the first reaction gas nozzle 31 and sufficiently heat the $TiCl_4$ molecules so that the $TiCl_4$ molecules are reliably adsorbed on the wafer W.

The film deposition apparatus 1 may also be applied to a process of forming a film other than a TiN film. For example, the film deposition apparatus 1 may be configured such that a bis-(tertiary butyl amino)-silane (BTBAS) gas and an ozone ($O_3$) gas are discharged from the first and second reaction gas nozzles 31 and 33 to form a silicon oxide film on the wafer W. Even in this case, the retaining space forming part 5 may be used so that adsorption of the BTBAS molecules on the wafer W and oxidation of the BTBAS molecules by the $O_3$ gas are performed more reliably.

Figure 9:
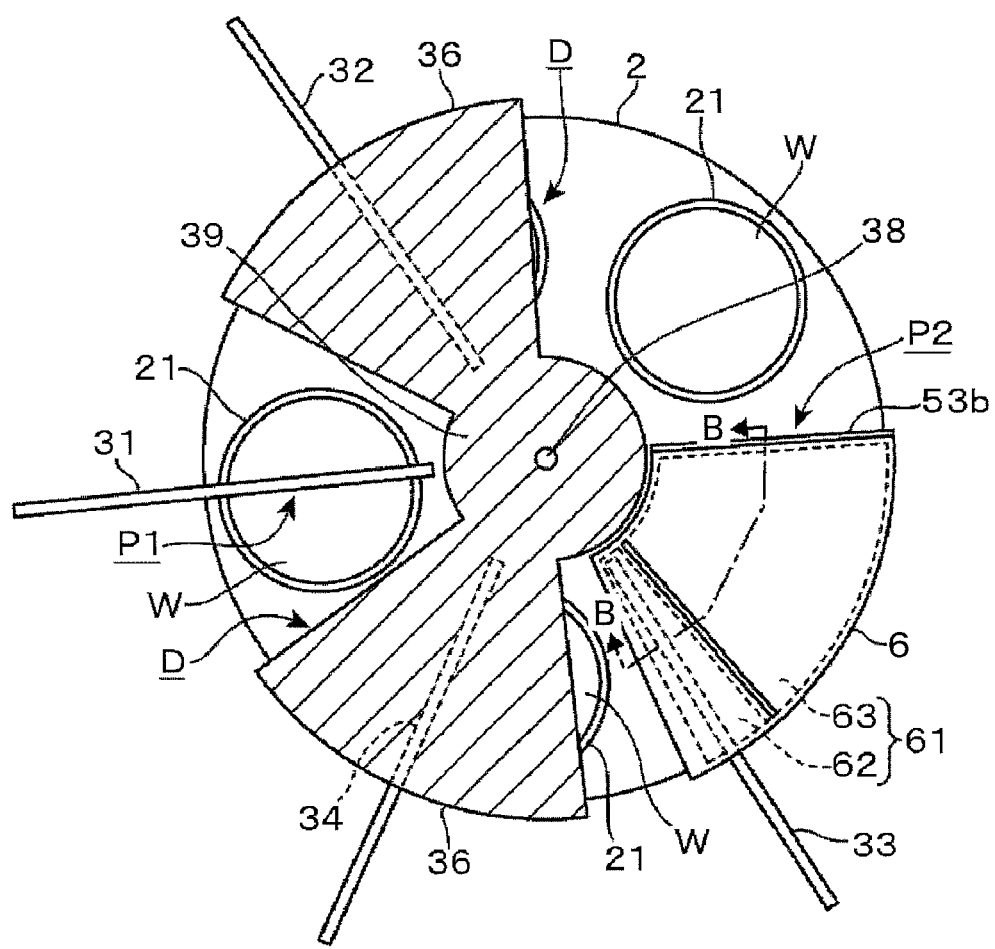
FIG. 9 is a plan view of a turntable and a retaining space forming part according to another embodiment.
Figure 10:
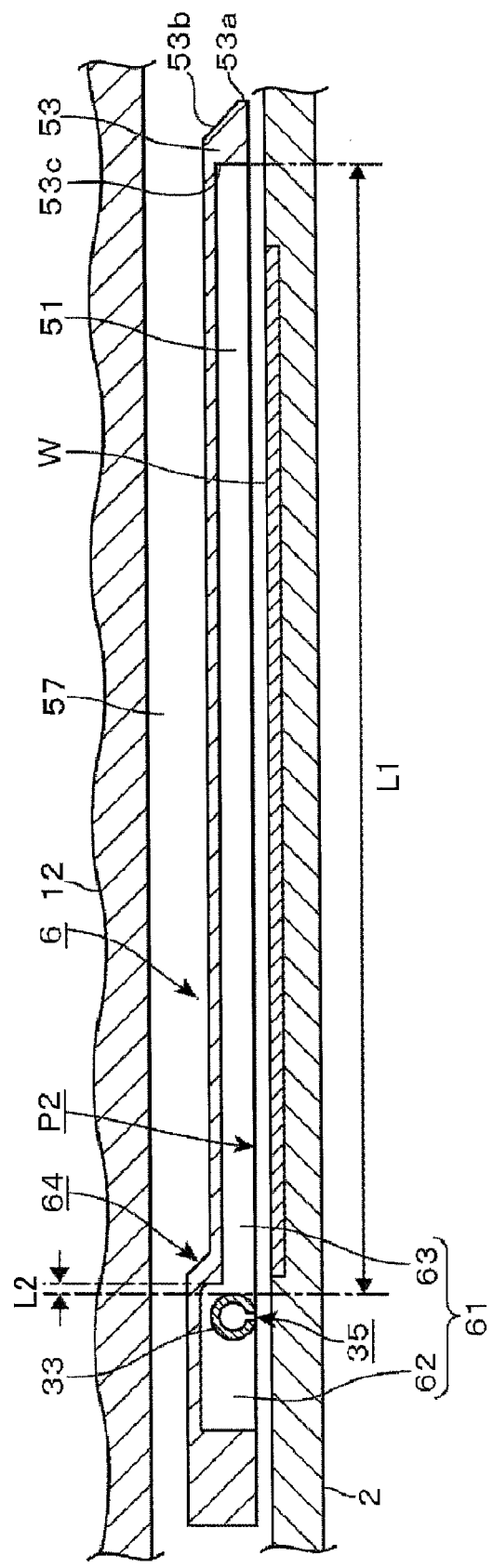
FIG. 10 is a cross-sectional view of the flow forming part taken along line B-B of FIG. 9.

Next, a retaining space forming part 6 according to another embodiment is described. FIG. 9 is a plan view of the retaining space forming part 6 and the turntable 2. FIG. 10 is a cross-sectional view of the flow forming part 6 taken along line B-B of FIG. 9. Differences between the retaining space forming part 6 and the retaining space forming part 5 are described below. A retaining space 61 formed by the retaining space forming part 6 includes a first area 62 and a second area 63 whose ceiling is lower than the ceiling of the first area 62. Each of the first area 62 and the second area 63 has a fan shape. The first area 62 is on the rotationally-downstream side and the second area 63 is on the rotationally-upstream side.

The second reaction gas nozzle 33 is disposed in the first area 62 and extends along the boundary between the first area 62 and the second area 63. A gap is provided between the ceiling of the second area 63 and the side surface of the second reaction gas nozzle 33 to allow the $NH_3$ gas to flow between the first area 62 and the second area 63. In the present embodiment, a distance L2 in FIG. 10 of the gap between the ceiling of the second area 63 and the side surface of the second reaction gas nozzle 33 is set at, for example, 2.5 mm. The distance L1 between the second reaction gas nozzle 33 and the inner surface 53c of the upstream side wall 53 is set in a manner similar to the distance L1 of the retaining space forming part 5. Also, the distances of gaps between components of the retaining space forming part 6 are set in a manner similar to those of the retaining space forming part 5.

In the retaining space forming part 6, since the height of the ceiling of the first region 62 is different from the height of the ceiling of the second area 63, a step 64 is formed on the upper surface of the upper wall 53. The $N_2$ gas flowing into the flow-through space 57 flows over the step 64 in the rotationally-downstream direction and is exhausted. The flow of the $N_2$ gas and the $NH_3$ gas around the retaining space forming part 6 is similar to the flow of the $N_2$ gas and the $NH_3$ gas around the retaining space forming part 5. However, with the retaining space forming part 6 where the ceiling of the second area 63 is lower than the ceiling of the first area 62, it is possible to more effectively increase the partial pressure and density of the $NH_3$ gas. Accordingly, the retaining space forming part 6 makes it possible to more reliably nitride the Ti molecules on the wafer W by the $NH_3$ gas.

Figure 11:
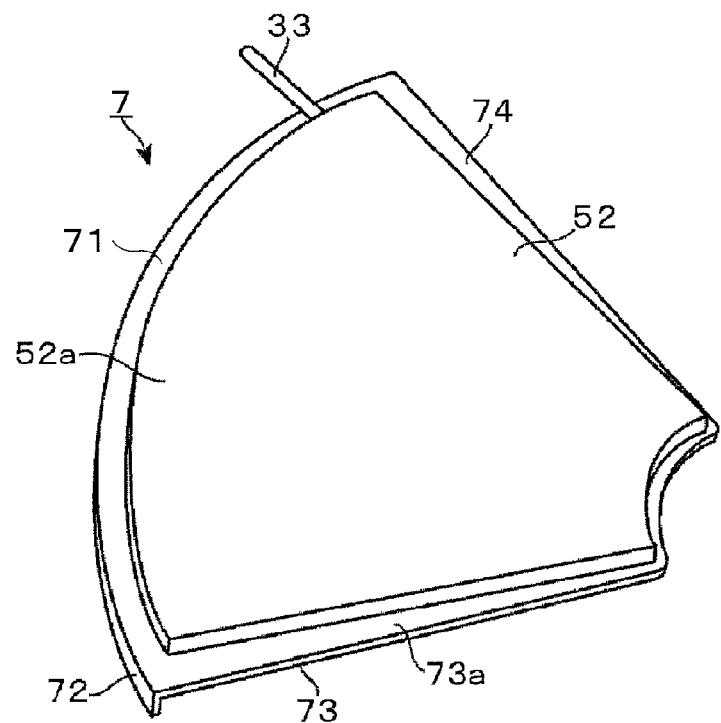
FIG. 11 is a perspective view of a retaining space forming part according to another embodiment.
Figure 12:
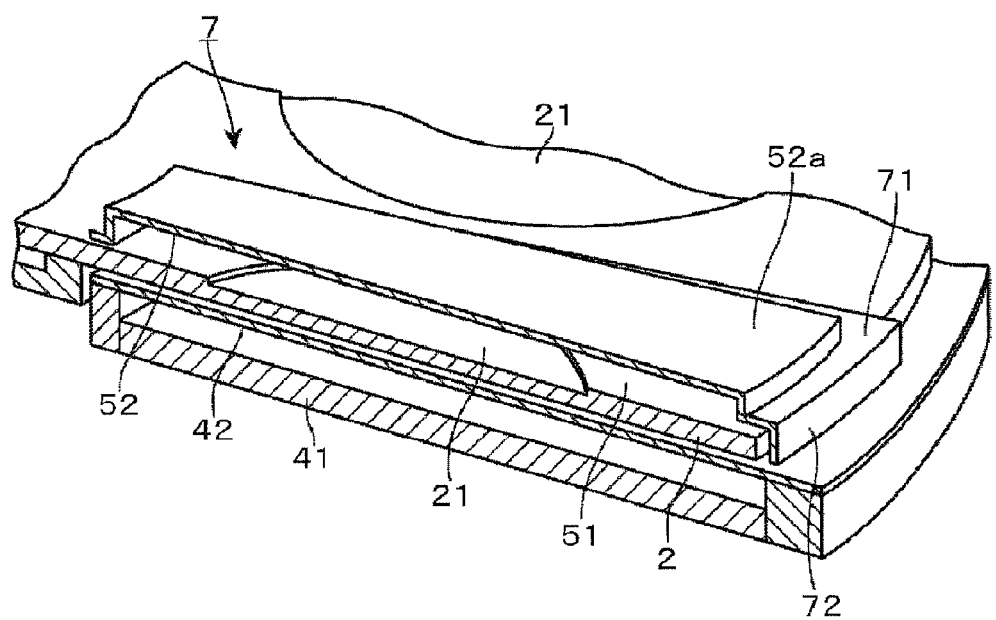
FIG. 12 is a cut-away perspective view of the retaining space forming part of FIG. 11.
Figure 13:
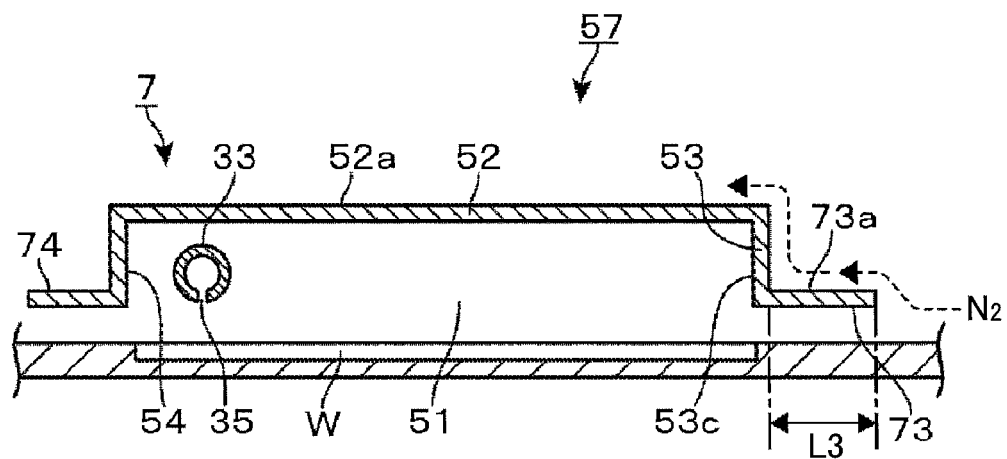
FIG. 13 is a cut-away side view of the retaining space forming part of FIG. 11.

Next, a retaining space forming part 7 according to still another embodiment is described. Below, differences between the retaining space forming part 7 and the retaining space forming parts 5 and 6 are mainly described. FIG. 11 is a perspective view, FIG. 12 is a cut-away perspective view, and FIG. 13 is a cut-away side view of the retaining space forming part 7. In the retaining space forming part 7, the upstream side wall 53, the downstream side wall 54, the outer wall 55, and the inner wall 56 are formed as vertical plates. A flow regulating plate 71 extends horizontally outward from the lower ends of the walls 53 through 56. Accordingly, the flow regulating plate 71 forms the periphery of the retaining space forming part 7. A part of the flow regulating plate 71 protruding from the outer wall 55 to the outside of the turntable 2 is bent downward to form an upright plate 72. As illustrated in FIG. 12, the upright plate 72 covers the outer end of the turntable 2 to more effectively increase the density of the $NH_3$ gas in the retaining space 51. The upright plate 72 may also be added to the retaining space forming parts 5 and 6 of the above embodiments.

Another part of the flow regulating plate 71 protruding from the upstream side wail 53 in the rotationally-upstream direction is referred to as a flow regulating plate 73. Also, a part of the flow regulating plate 71 protruding from the downstream side wall 54 in the rotationally downstream direction is referred to as a flow regulating plate 74. As illustrated in FIG. 13, an upper surface 73a of the flow regulating plate 73 functions as a guide surface that guides the $N_2$ gas flowing from the rotationally-upstream side to the flow-through space 57. A length L3 of the flow regulating plate 73 in FIG. 13 is set at, for example, from 5 mm to 100 mm.

The flow regulating plate 74 contributes to increasing the density of the $NH_3$ gas in the lower part of the retaining space 51. The distance L1 between the second reaction gas nozzle 33 and the inner surface 53c of the upstream side wall 53 is set in a manner similar to the distance L1 of the retaining space forming part 5. The retaining space forming part 7 provides advantageous effects similar to those of the retaining space forming part 5.

Figure 14:
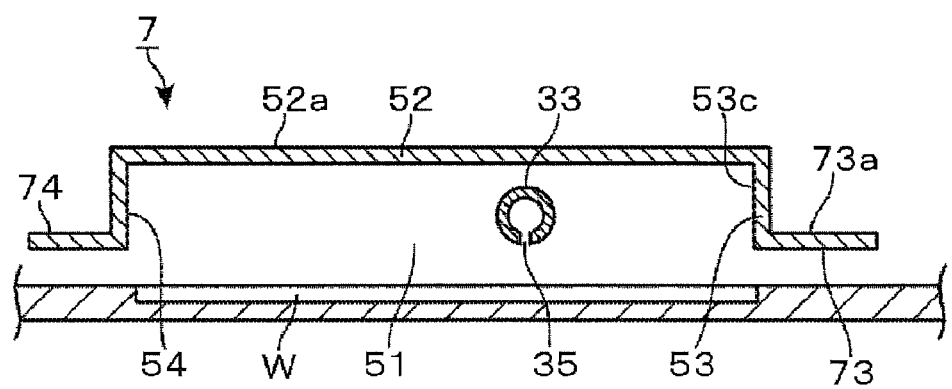
FIG. 14 is a cut-away side view of the retaining space forming part of FIG. 11.
Figure 15:
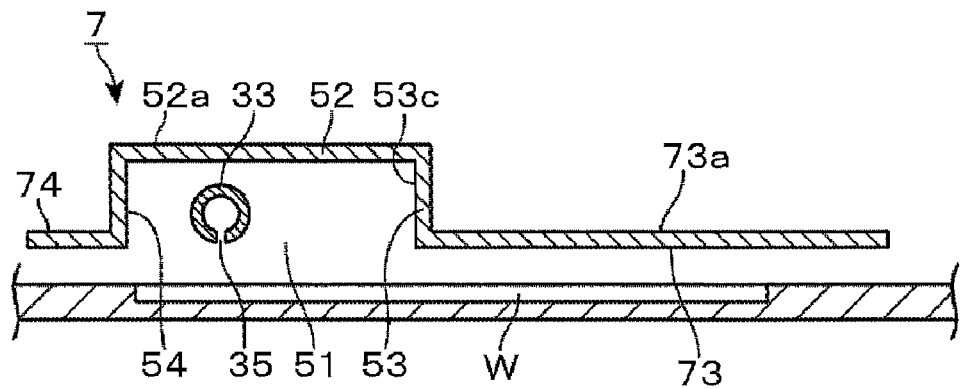
FIG. 15 is a drawing illustrating a variation of the retaining space forming part of FIG. 11.
Figure 16:
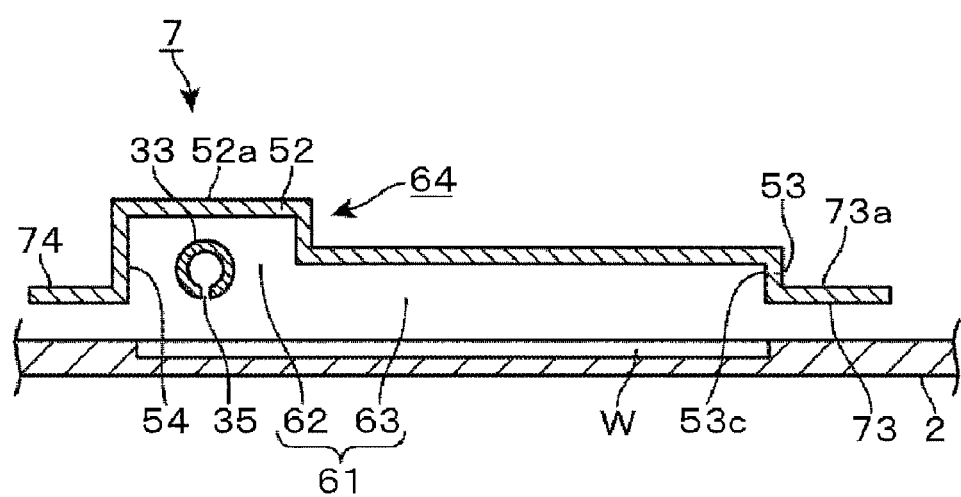
FIG. 16 is a drawing illustrating another variation of the retaining space forming part of FIG. 11.
Figure 17:
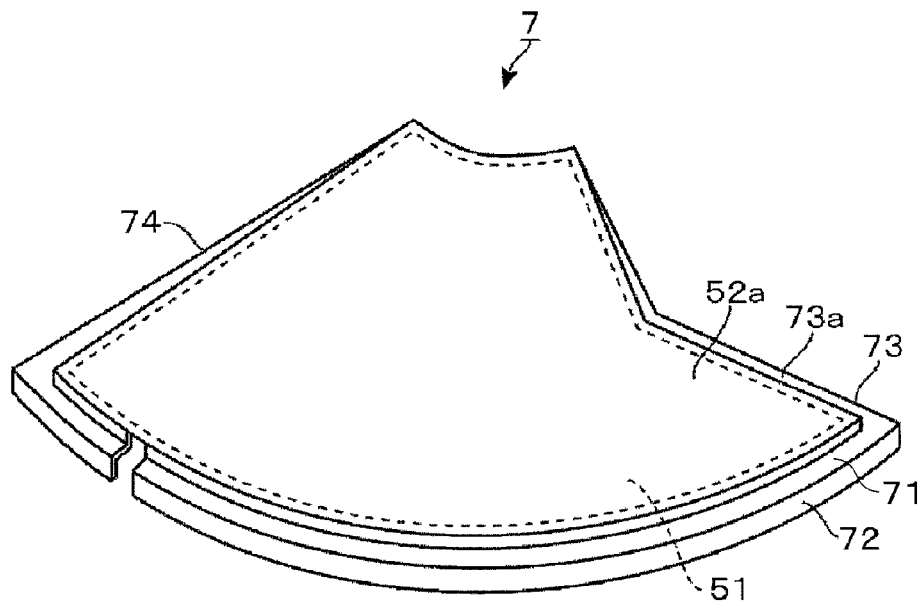
FIG. 17 is a drawing illustrating still another variation of the retaining space forming part of FIG. 11.

In the above embodiments, the second reaction gas nozzle 33 is disposed in the rotationally-downstream side of the retaining space 51. However, as long as the distance L1 is set within the above described range, the second reaction gas nozzle 33 may be disposed at any position in the retaining space 51. For example, the second reaction gas nozzle 33 may be disposed in the rotationally-upstream side of the retaining space 51 as illustrated in FIG. 14. Also, the second reaction gas nozzle 33 may be disposed to equally divide the retaining space 51 in the rotational direction of the turntable 2. Also, as illustrated in FIG. 15, the length of the retaining space 51 in the rotational direction may be less than the length of the flow regulating plate 73 in the rotational direction. Also, as illustrated in FIG. 16, similarly to the retaining space forming part 6, the retaining space forming part 7 including the flow regulating plate 71 may be configured to form the retaining space 61 including the first area 62 and the second area 63 whose ceiling is lower than the ceiling of the first area 62. The retaining space 51 may also have a shape other than a fan shape in plan view. For example, the retaining space 51 may have a polygonal shape as illustrated in FIG. 17.

The retaining space forming parts of the above embodiments may also be applied to an apparatus other than a film deposition apparatus. For example, the retaining space forming parts of the above embodiments may be applied to an apparatus that supplies a reaction gas to a wafer W in a first process area to form a film and supplies an inert gas to the wafer W in a second process area to perform an annealing treatment on the formed film. As another example, the retaining space forming parts of the above embodiments may be applied to an apparatus that supplies a reaction gas to a wafer W in a first process area to form a film and oxidizes the formed film in a second process area by supplying an oxidation gas and converting the oxidation gas into plasma. As still another example, the retaining space forming parts of the above embodiments may be applied to an apparatus that supplies gases to a wafer W in process areas to etch a film formed on the wafer W.

Evaluation tests performed to evaluate the effects of the retaining space forming parts of the above embodiments are described below.

(Evaluation Test 1)

In a simulation for the film deposition apparatus 1 including the retaining space forming part 5, the flow rate of the $N_2$ gas from the separation gas nozzles 32 and 34 was varied to measure the resistance (ohm/sq) at a predetermined position in the second process area P2 in the retaining space 51. A greater resistance value indicates a greater amount of the $N_2$ gas that flows into the retaining space 51. The flow rate of the $N_2$ gas was set at 5000 sccm, 8000 sccm, and 10000 sccm. This test is referred to as evaluation test 1-1. Another simulation was performed to measure the resistance in the second process area P2 under substantially the same conditions as in evaluation test 1-1 except that a film deposition apparatus not including the retaining space forming part 5 was assumed. This test is referred to as evaluation test 1-2.

Figure 18:
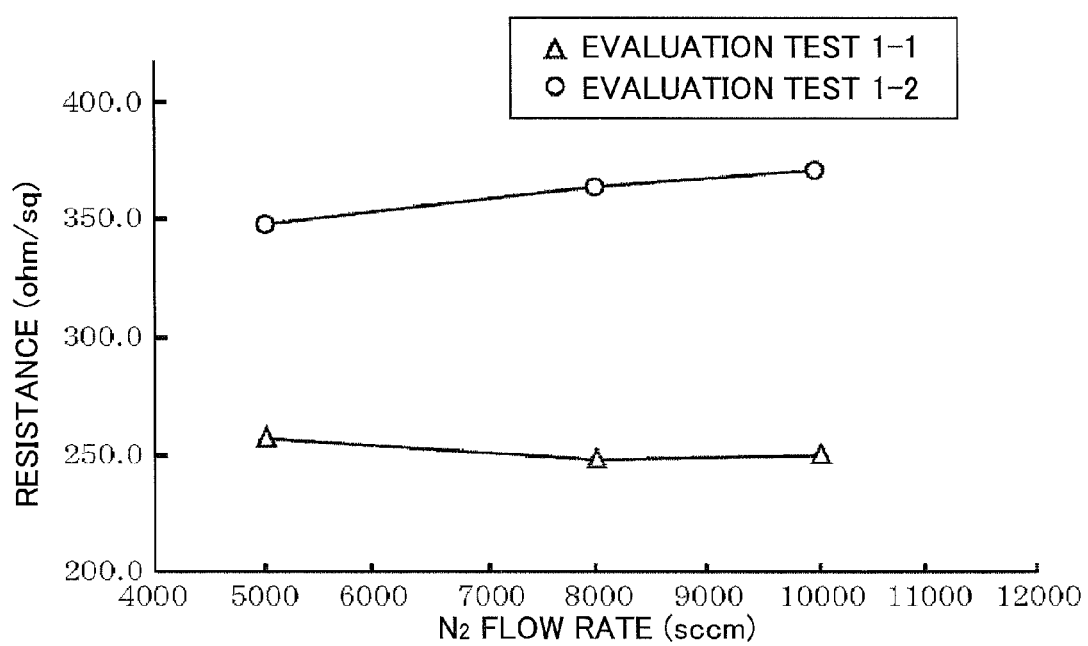
FIG. 18 is a graph illustrating results of evaluation tests.

FIG. 18 is a graph illustrating results of evaluation tests 1-1 and 1-2. In FIG. 18, the horizontal axis indicates the flow rate of the $N_2$ gas and the vertical axis indicates the resistance. At all flow rates of the $N_2$ gas, the measured resistance values in evaluation test 1-1 are lower than those in evaluation test 1-2. In evaluation test 1-2, the resistance gradually increases as the flow rate of the $N_2$ gas increases. Meanwhile, in evaluation 1-1, the resistance remains substantially constant regardless of the flow rate of the $N_2$ gas. Thus, the results of evaluation tests 1-1 and 1-2 indicate that the retaining space forming part 5 reduces the amount of the $N_2$ gas flowing into the second process area P2.

(Evaluation Test 2)

A simulation was performed for the film deposition apparatus 1 including the retaining space forming part 5 disposed around the second reaction gas nozzle 33 to measure the resistance on the wafer W in the second process area P2. The resistance was measured at plural measurement positions arranged at intervals on the wafer W. This test is referred to as evaluation test 2-1. Another simulation was performed to measure the resistance on the wafer W under substantially the same conditions as in evaluation test 2-1 except that a film deposition apparatus not including the retaining space forming part 5 was assumed. This test is referred to as evaluation test 2-2.

Figure 19:
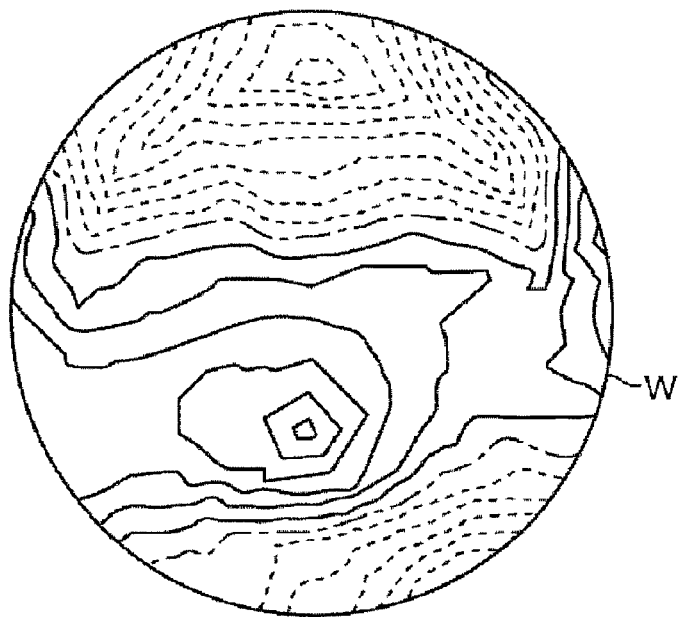
FIG. 19 is a drawing illustrating the distribution of resistance values on a wafer surface in an evaluation test.
Figure 20:
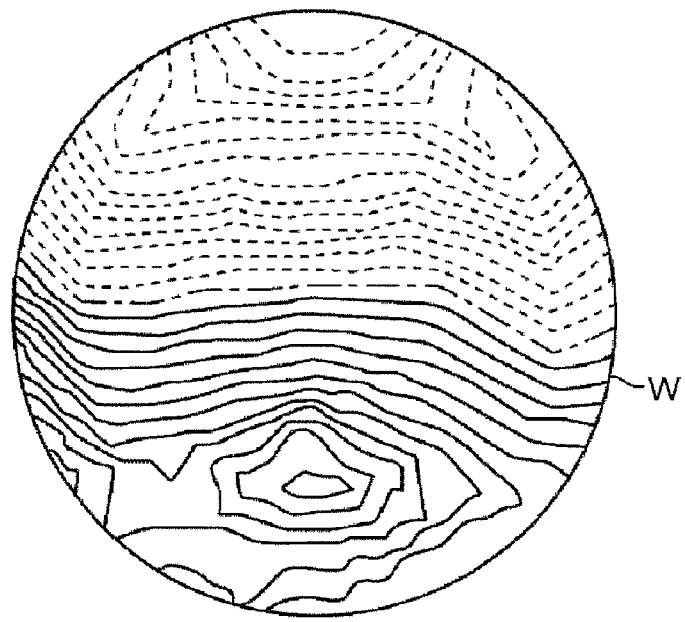
FIG. 20 is a drawing illustrating the distribution of resistance values on a wafer surface in another evaluation test.

In evaluation test 2-1, the average of resistance values measured at the measurement positions is 229.0 ohm/sq. Meanwhile, in evaluation test 2-2, the average of resistance values measured at the measurement positions is 259.0 ohm/sq. Thus, the average resistance value in evaluation test 2-1 is lower than the average resistance value in evaluation test 2-2. This indicates that the retaining space forming part 5 reduces the amount of the $N_2$ gas flowing into the second process area P2. In FIGS. 19 and 20, the distribution of resistance values on the wafer W measured in evaluation tests 2-1 and 2-2 is indicated by contour lines. High-resistance areas where the resistance is relatively high are surrounded by solid contour lines, and low-resistance areas where the resistance is relatively low are surrounded by dotted contour lines. Also in FIGS. 19 and 20, the boundary between the high-resistance areas and the low-resistance areas is indicated by a dashed-dotted contour line.

In FIG. 20 representing the results of evaluation test 2-2, the space between the contour lines is narrower than that in FIG. 19 representing the results of evaluation test 2-1. This indicates that the variation in the measured resistance on the wafer W in evaluation test 2-2 is greater than that in evaluation test 2-1. Thus, the results of evaluation test 2 indicate that the retaining space forming part 5 makes it possible to reduce the amount of the $N_2$ gas supplied to the surface of the wafer W and thereby reduce the variation in the density of a reaction gas on the surface of the wafer W. In other words, the retaining space forming part 5 makes it possible to uniformly supply a reaction gas at high density on the wafer W and thereby makes it possible to reliably and uniformly process the wafer W with the reaction gas. The above results of the evaluation tests are also applicable to the retaining space forming parts of other embodiments described above.

An aspect of this disclosure provides a technology that makes it possible to increase the density and partial pressure of a reaction gas in a process area and thereby makes it possible to reliably process a substrate with the reaction gas.

An aspect of this disclosure provides a substrate processing apparatus including a gas nozzle and a cover part configured to retain a reaction gas around the gas nozzle. The distance between the gas nozzle and a rotationally-upstream side wall of the cover part is greater than a predetermined value. This configuration makes it possible to prevent the reaction gas supplied in a space formed by the cover part from flowing out of the space and flowing over the upper surface of the cover part, and thereby makes it possible retain the reaction gas around the gas nozzle. This in turn makes it possible to prevent a decrease in the density and partial pressure of the reaction gas in a process area, reliably process a substrate, and thereby improve the quality of a film formed on the substrate.

A substrate processing apparatus and a film deposition apparatus of the preferred embodiments are described above. However, the present invention is not limited to the specifically disclosed embodiments, and variations and modifications may be made without departing from the scope of the present invention.

What is claimed is:

1. A substrate processing apparatus, comprising:
   a processing chamber;
   a plurality of process areas provided in the processing chamber, each of the process areas being configured to supply a reaction gas to process a substrate;
   a turntable provided in the processing chamber and configured to rotate such that the substrate placed on an upper surface of the turntable passes through the process areas in sequence;
   a gas nozzle provided in one of the process areas and extending in a direction that intersects with a rotational direction of the turntable, the gas nozzle having discharge openings that are arranged along a length of the gas nozzle and configured to discharge the reaction gas;
   a separating area provided between the process areas in the rotational direction and configured to supply a separation gas to separate atmospheres of the process areas; and
   a cover part configured to cover the gas nozzle and cause the reaction gas supplied from the gas nozzle to remain around the gas nozzle, the cover part including
      an upstream side wall disposed at an upstream side of the process area where the gas nozzle is provided in the rotational direction,
      a downstream side wall disposed at a downstream side of the process area where the gas nozzle is provided in the rotational direction,
      an upper wall disposed above the gas nozzle and configured to cause the separation gas flowing from the upstream side in the rotational direction to flow over the cover part to the downstream side in the rotational direction,
      an outer wall at an outer circumference of the turntable, and
      an inner wall on a side of a center of the turntable so as to face the outer wall;
   wherein the cover part further includes a guide surface configured to guide the separation gas flowing from the upstream side in the rotational direction to flow over a lower part of the upstream side wall to a space above the upper wall;
   wherein a distance between the gas nozzle and the upstream side wall is greater than or equal to 8 mm,
   wherein the outer wall has a slit portion into which the gas nozzle is inserted, said slit portion being on the downstream side of the cover part,
   wherein the upstream wall, the down stream wall, the upper wall, the outer wall and the inner wall define a retaining space, and
   wherein the inner wall extends between the upstream and downstream walls without a slit.

2. The substrate processing apparatus as claimed in claim 1, wherein the processing chamber includes an evacuation port formed at a position downstream of the cover part in the rotational direction and configured to evacuate the processing chamber.

3. The substrate processing apparatus as claimed in claim 1, wherein
   the cover part is configured to form a space including a first area and a second area around the gas nozzle;
   the gas nozzle is disposed in the first area; and
   the second area is disposed upstream of the first area in the rotational direction and has a ceiling that is lower than a ceiling of the first area.

4. The substrate processing apparatus as claimed in claim 1, wherein the guide surface is a sloping surface that slopes down toward the upstream side in the rotational direction.

5. The substrate processing apparatus as claimed in claim 4, wherein the sloping surface is a surface of the upstream side wall of the cover part.

6. The substrate processing apparatus as claimed in claim 1, wherein
   the upstream side wall of the cover part includes a flow regulating plate protruding toward the upstream side in the rotational direction; and
   the guide surface is a surface of the flow regulating plate.

7. The substrate processing apparatus as claimed in claim 1, wherein a gap is provided between the gas nozzle and the upper wall of the cover part to allow the reaction gas to flow through the gap.

8. A film deposition apparatus, comprising:
   a processing chamber;
   a plurality of process areas provided in the processing chamber, each of the process areas being configured to supply a reaction gas to form a film on a substrate;

a turntable provided in the processing chamber and configured to rotate such that the substrate placed on an upper surface of the turntable passes through the process areas in sequence;

a gas nozzle provided in one of the process areas and extending in a direction that intersects with a rotational direction of the turntable, the gas nozzle having discharge openings that are arranged along a length of the gas nozzle and configured to discharge the reaction gas;

a separating area provided between the process areas in the rotational direction and configured to supply a separation gas to separate atmospheres of the process areas; and a cover part configured to cover the gas nozzle and cause the reaction gas supplied from the gas nozzle to remain around the gas nozzle, the cover part including an upstream side wall disposed at an upstream side of the process area where the gas nozzle is provided in the rotational direction, a downstream side wall disposed at a downstream side of the process area where the gas nozzle is provided in the rotational direction, an upper wall disposed above the gas nozzle and configured to cause the separation gas flowing from the upstream side in the rotational direction to flow over the cover part to the downstream side in the rotational direction, an outer wall at an outer circumference of the turntable, and an inner wall on a side of a center of the turntable so as to face the outer wall;

wherein the cover part further includes a guide surface configured to guide the separation gas flowing from the upstream side in the rotational direction to flow over a lower part of the upstream side wall to a space above the upper wall;

wherein a distance between the gas nozzle and the upstream side wall is greater than or equal to 8 mm, wherein the outer wall has a slit portion into which the gas nozzle is inserted, said slit portion being on the downstream side of the cover part, wherein the upstream wall, the down stream wall, the upper wall, the outer wall and the inner wall define a retaining space, and wherein the inner wall extends between the upstream and downstream walls without a slit.

* * * * *